United States Patent [19]
Claisse et al.

[11] Patent Number: 6,084,900
[45] Date of Patent: Jul. 4, 2000

[54] ANNULAR WAVEGUIDE VERTICAL CAVITY SURFACE EMITTING LASER ARRAY AND METHOD OF FABRICATION

[75] Inventors: Paul R. Claisse; Philip A. Kiely; Jamal Ramdani, all of Gilbert; Wenbin Jiang, Phoenix, all of Ariz.

[73] Assignee: Motorola, Inc., Schaumburg, Ill.

[21] Appl. No.: 08/998,365

[22] Filed: Dec. 24, 1997

[51] Int. Cl.[7] .............................. H01S 3/23; H01S 3/085
[52] U.S. Cl. ................................. 372/50; 372/23; 372/96
[58] Field of Search ................................. 372/50, 96, 23

[56] References Cited

U.S. PATENT DOCUMENTS

| | | | |
|---|---|---|---|
| 5,831,960 | 11/1998 | Jiang et al. | 369/121 |
| 5,898,722 | 4/1999 | Ramdani et al. | 372/50 |
| 5,963,568 | 10/1999 | Paoli | 372/23 |
| 5,986,998 | 11/1999 | Park | 369/121 |

*Primary Examiner*—James W. Davie
*Attorney, Agent, or Firm*—Eugene A. Parsons; William E. Koch

[57] ABSTRACT

An array of annular waveguide VCSELs for achieving a stable single high order mode light source characterized as emitting a plurality of emission beams of varying wavelengths. The device array including a first mirror stack with mirror pairs in a $Al_xGa_{1-x}As/Al_yGa_{1-y}As$ material system lattice matched to an active region. The active region includes an active structure sandwiched between a first cladding region adjacent the first mirror stack and a second cladding region, the active structure having at least one quantum well. The VCSEL further includes a second mirror stack lattice matched to the second cladding region and having mirror pairs in a $Al_xGa_{1-x}As/Al_yGa_{1-y}As$ material system. The second mirror stack is etched to define a first VCSEL and at least one additional VCSEL, each VCSEL including an etched region, thereby defining an annular emission region through which light generated by the annular waveguide VCSEL is emitted.

13 Claims, 2 Drawing Sheets

ANNULAR WAVEGUIDE VERTICAL CAVITY SURFACE EMITTING LASER ARRAY AND METHOD OF FABRICATION

FIELD OF THE INVENTION

This invention relates to vertical cavity surface emitting lasers and more specifically to arrays of vertical cavity surface emitting lasers for single high order mode operation.

BACKGROUND OF THE INVENTION

In the past few years there has been an increased interest in the utilization of fiber interconnects in the telecommunications industry. Typically, fibers used in telecommunications are deployed underground and can potentially utilize a vertical cavity surface emitting laser (VCSEL) as the light source. It is generally well known in the art that these types of fibers can only support one channel. To increase the data transmission rate at which these fiber interconnects operate, parallel data communication techniques are required. In general, parallel data communication technology requires the use of more than one channel, thus more than one beam of light, in the fiber interconnects. In that these telecommunications fibers are generally deployed underground, it is very expensive to deploy additional fibers to achieve multi-channel parallel data communication thereby increasing data transmission rates.

To achieve this multi-channel parallel data communication, wavelength division multiplexing (WDM) is utilized. In WDM, different wavelength beams can be combined into one fiber interconnect, with each wavelength beam being individually modulated to carry data bits, or information. Once the combined beam has reached its destination, it can be easily separated using demultiplexing techniques. In general, different wavelength beams can be multiplexed into the same fiber as different data channels. By utilizing this WDM technology, there is no need to redeploy the fiber interconnects already positioned underground to achieve high speed data communication through parallel data transmission.

To increase the efficiency of the system, the packing density of the light source, the VCSELs, can be increased by making the wavelength difference between the neighboring channels, or VCSEL beams, as small as possible, but large enough to be demultiplexed without severe cross-talk between the channels. In addition, the wavelength of the individual beams must be stable to temperature and bias current variations so as to allow the receiving end to distinguish between different channels. To achieve the highest possible packing density and resolution between the channels, the device should operate at single mode frequency. Using conventional VCSEL technology, however, it is difficult to achieve multiple single mode wavelength in a single array.

It would be highly advantageous, therefore, to remedy the foregoing and other deficiencies inherent in the prior art.

Accordingly, it is an object of the present invention to provide a new and improved laser beam light source for use in multi-channel parallel data communication.

It is another object of the present invention to provide stable single high order mode laser source fabricated as a annular waveguide VCSEL array.

Another object of the invention is to provide a reliable single high order mode VCSEL array characterized as emitting a plurality of laser beams of varying wavelength.

Another object of the present invention is to provide for a method of fabricating an annular waveguide VCSEL array that includes the etching of a plurality of mirror stacks of varying widths so as to force the lasing mode of each VCSEL device to be confined to an annular region thereby forcing each VCSEL to operate in a single high order mode at a specific wavelength.

SUMMARY OF THE INVENTION

Briefly, to achieve the desired objects of the instant invention in accordance with a preferred embodiment thereof, provided is an array of annular waveguide VCSELs, including a first annular waveguide VCSEL and at least one additional annular waveguide VCSEL, each characterized as emitting light of a wavelength different than the other. The VCSEL devices each operating in a single high order mode. The VCSEL array includes a first mirror stack, an active region with at least one quantum well, the active region being disposed on the first mirror stack, and a second mirror stack disposed on the active region. The second mirror stack is etched to define a plurality of mesa or ride-like VCSEL devices, thereby providing for a plurality of annular waveguide devices, each VCSEL device emitting light in a single high order mode of a wavelength different than the other VCSEL devices in the array.

Also provided is a method of fabricating an annular waveguide VCSEL array including a first annular waveguide VCSEL and at least one additional annular waveguide VCSEL, each operating in a single high order mode. The method includes providing a substrate having a surface, epitaxially growing a first mirror stack on the surface, epitaxially growing an active region with at least one quantum well on the first mirror stack, epitaxially growing a second mirror stack on the active region. The second mirror stack is etched to define a plurality of VCSEL devices each defining an annular waveguide.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE DRAWINGS

Figure 1:
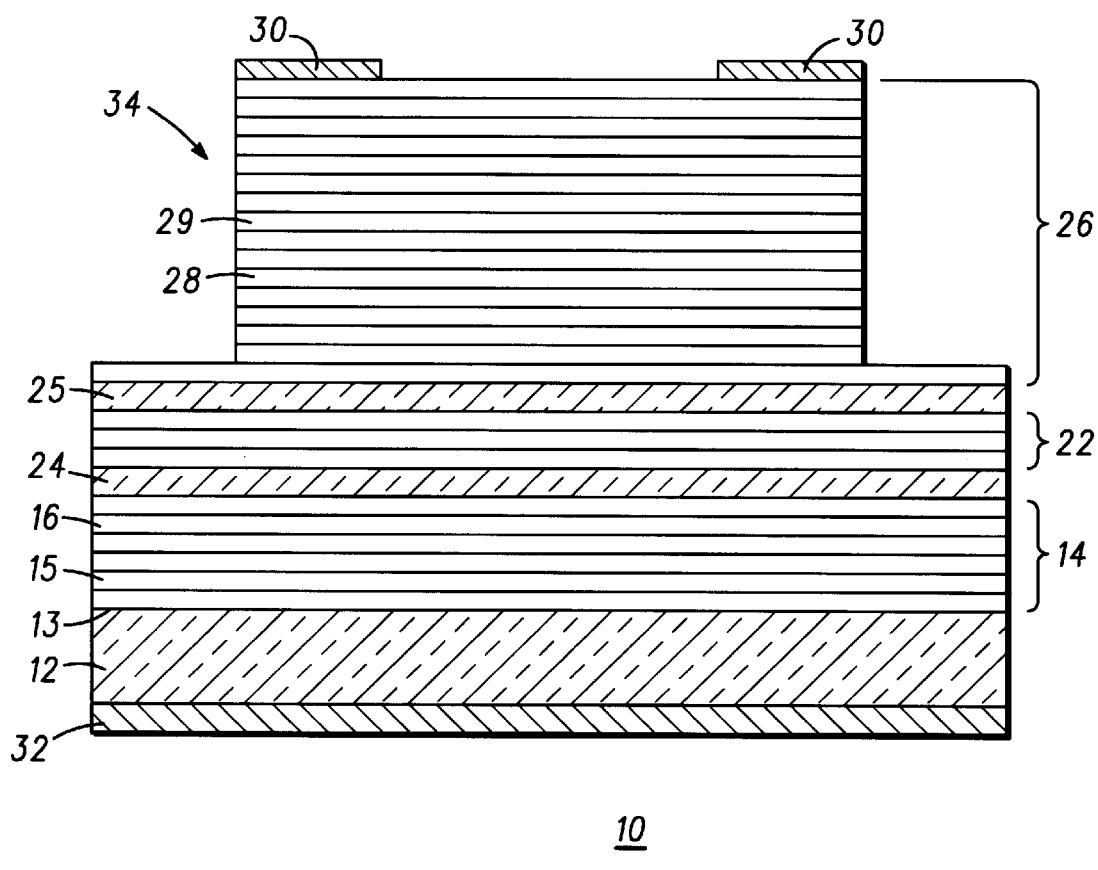
FIG. 1 is a sectional view of a annular waveguide VCSEL according to the present invention.

Turning now to the drawings in which like reference characters indicate corresponding elements throughout the several views, attention is first directed to FIG. 1 which illustrates in simplified sectional view a step in the fabrication of an annular waveguide VCSEL 10 of which a plurality make up an array of annular waveguide VCSELs according to the present invention. Annular waveguide VCSEL 10 is generally fabricated similar to the standard mesa, or ridge-like waveguide VCSEL well known in the art. More specifically, annular waveguide VCSEL 10 includes a substrate 12, which in this specific embodiment, is GaAs. GaAs is preferably used to facilitate epitaxial growth of the components of VCSEL 10 which is fabricated to operate in a stable single high order mode. It should be understood that GaAs is only utilized as an example and other semiconductor materials may be employed as substrate 12.

Substrate 12 has an upper surface 13 on which a first mirror stack 14 is disposed. First mirror stack 14 includes a plurality of mirror pairs 15 and 16 in a n-doped $Al_xGa_{1-x}As/Al_yGa_{1-y}As$ material system. An active region 20 is disposed on first mirror stack 14. Active region 20 includes an active structure 22 in an AlGaAs material system, sandwiched between a n-doped first cladding region 24, adjacent first mirror stack 14, and a p-doped second cladding region 25. A second mirror stack 26 is disposed on second cladding region 25 and includes mirror pairs 28 and 29 in a p-doped $Al_xGa_{1-x}As/Al_yGa_{1-y}As$ material system. Finally, a contact layer 30 is deposited on second mirror stack 26.

First mirror stack 14 is grown by epitaxially depositing pairs of layers 15 and 16 on substrate 12. In order to crystal lattice match mirror stack 14 to substrate 12 a suitable semiconductor material system must be deposited. In this specific example, substrate 12 is GaAs and, therefore, a $Al_xGa_{1-x}As/Al_yGa_{1-y}As$ material system is employed. Approximately 20 to 40 mirror pairs of this material system are deposited on substrate 12 depending on the difference between the refractive indices of the layers. The different refractive index of the layers of each pair is achieved by altering the aluminum content. In this specific embodiment, a $Al_{0.80}Ga_{0.20}As$ layer 15 and a $Al_{0.15}Ga_{0.85}As$ 16 layer forming a mirror pair is preferred. The large number of pairs increases the percentage of reflected light.

Cladding region 24 includes one or more layers which may be graded. In this specific embodiment, cladding region 24 is formed of a AlGaAs material system. For example cladding region 24 includes a first layer (not shown) formed of an n-doped AlGaAs with the Al mole fraction ranging from 40% to 60% and a second layer (not shown) formed of an undoped AlGaAs material having an Al mole fraction ranging from 30% to 40% for better carrier confinement of active structure 22.

Active structure 22, in this embodiment, includes three quantum well layers (not shown), separated by barrier layers (not shown). For example, the quantum well layers and the barrier layers are each approximately 100Å and the total thickness of active structure 22 is approximately one wavelength of the emitted light or a multiple thereof. One skilled in the art will understand that more or fewer quantum well layers and barrier layers can be used depending upon the application. Active region 20 and first and second mirror stacks 14 and 26 respectively of each of the individual VCSEL devices are configured to emit light with wavelengths ranging from approximately 765–970 nm, more commonly from approximately 830 nm to 860 nm.

Cladding region 25 includes one or more layers which may be graded if necessary. In this specific embodiment, cladding region 25 is formed of a AlGaAs material system. For example cladding region 25 includes a first layer (not shown) formed of undoped AlGaAs with an Al mole fraction ranging from 30% to 40%, and a second layer (not shown) formed of a p-doped AlGaAs material having an Al mole fraction ranging from 40% to 60% for better carrier confinement.

Mirror stack 26 is grown by epitaxially depositing pairs of layers on cladding region 25. In order to crystal lattice match mirror stack 26 to active structure 22, a suitable semiconductor material system must be deposited. In this specific example, cladding region 25 is GaAs based and, therefore, a $Al_xGa_{1-x}As/Al_yGa_{1-y}As$ material system is employed. Approximately 20 to 40 mirror pairs of this material system are deposited on cladding region 25 depending on the difference between the refractive indices of the layers. The different refractive index the layers of each pair is achieved by altering the aluminum content. In this specific embodiment, a $Al_{0.80}Ga_{0.20}As$ layer 28 and a $Al_{0.15}Ga_{0.85}As$ layer 29 forming a mirror pair is preferred. The large number of pairs increases the percentage of reflected light. In an alternative embodiment, second mirror stack 26 is formed as a hybrid mirror stack, including a partial growth structure as discussed above and a dielectric material including alternating pairs of silicon oxide ($SiO_2$) and titanium oxide ($TiO_2$), or similar dielectric material. It should additionally be understood that second mirror stack 26 can be formed of strictly alternating layers of a dielectric material.

To complete VCSEL 10, contact layer 30 is positioned on mirror stack 26, and a contact layer 31 is positioned on substrate 22, for example on the rear surface thereof. As will be understood by those skilled in the art, contact 30 is so constructed as to permit the emission of light from VCSEL 10

Figure 2:
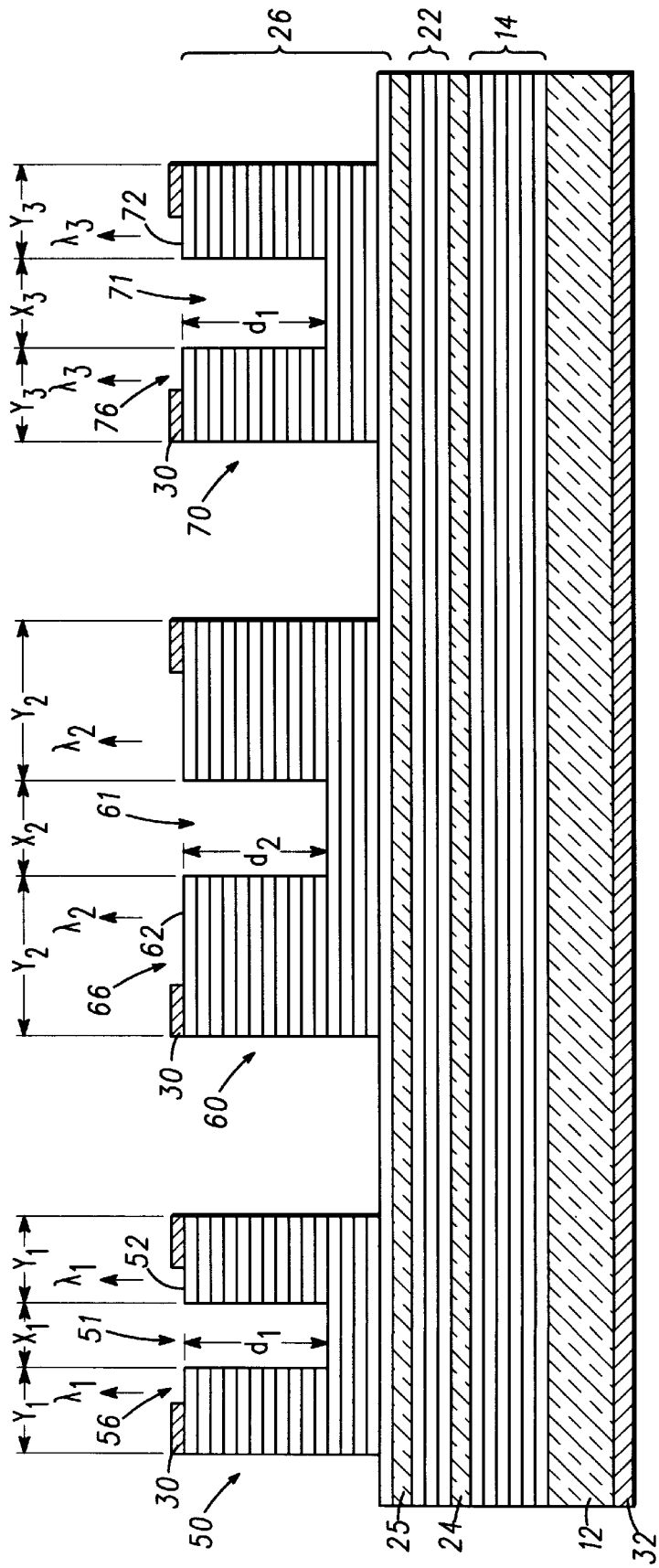
FIG. 2 is a sectional view of an array of annular waveguide VCSELs in accordance with the present invention.

Annular waveguide VCSEL 10, and more particularly the array of VCSEL devices, as illustrated in FIG. 2 and discussed presently, is fabricated by epitaxial growth of the plurality of layers of different compositions previously identified. Epitaxial deposition of the plurality of layers is accomplished by well known techniques in the art such as MBE, MOCVD, or the like. These techniques enable epitaxial deposition of relatively thin and thick layers of a variety of materials such as gallium arsenide, aluminum gallium arsenide, aluminum arsenide, silicon or the like. Fabrication of VCSEL devices typically use epitaxial deposition extensively to produce the multitude of layers of different materials which make up the device.

Referring now to FIG. 2, illustrated in simplified sectional view is an array 40 of annular waveguide VCSEL devices including a first annular waveguide vertical cavity surface emitting laser and at least one additional annular waveguide vertical cavity surface emitting laser. In this particular embodiment, illustrated are three vertical cavity surface emitting laser devices referenced 50, 60 and 70. It should be understood that dependent upon the actual number of varying channels needed for parallel data communication, array 40 can include more or less annular waveguide vertical cavity surface emitting laser devices. It should be understood that VCSEL devices 50, 60 and 70 are generally fabricated similar to VCSEL 10 of FIG. 1, which was described as a single VCSEL device of the array in accordance with the present invention. In addition it should be understood that like reference characters indicate corresponding elements throughout the several views.

Once the deposition of the plurality of layers of different compositions is complete, each individual annular waveguide VCSEL 50, 60 and 70, generally similar to VCSEL 10 of FIG. 1, is defined. More particularly, a portion of second mirror stack 26 is selectively removed to define the individual mesa, or ridge like structures which define VCSEL devices 50, 60 and 70. As a final step in the formation of each individual VCSEL device 50, 60 and 70, an area is selectively etched in each device 50, 60 and 70, to form a non-lasing area, or etched region 51, 61 and 71, respectively. During the etching process, a portion of second mirror stack 26 of each VCSEL device 50, 60 and 70 is etched down from an uppermost surface 52, 62 and 72 respectively to a depth noted by "$d_1$, $d_2$ and $d_3$" in FIG. 2, approximately 0.1–3.0 microns using one of a dry etch process or a wet etch process. It should be understood that that the depth of etching can be increased or decreased dependent upon the specific wavelength of emission sought for that specific laser device. This circular portion of the second mirror stack 26 that is removed has the effect of preventing the devices from lasing in these etched regions 51, 61 and 71 due to insufficient reflectivity to support lasing. This in effect forces each VCSEL device 50, 60 and 70 to operate in a single high order mode partially due to annular waveguiding. Accordingly, light referenced as wavelength 1 ($\lambda_1$), wavelength 2 ($\lambda_2$) and wavelength 3 ($\lambda_3$) generated by VCSELs 50, 60, and 70, respectively, is emitted in an annular emission region 56, 66, and 76, respectively. The mode order and wavelength of the laser emission that annular waveguide VCSEL devices 50, 60 and 70 can support is adjustable by varying the diameter, "$x_1$, $x_2$ and $x_3$", of etched region 51, 61 and 71 relative to the mesa diameter, "$y_1$, $y_2$ and $y_3$", of VCSELs 50, 60 and 70. Typically, the larger the etch diameter, the higher the mode order, and thus the shorter the wavelength of the laser emission.

By varying the central etched structure, more specifically etched region 51, 61 and 71, of each VCSEL device 50, 60 and 70, we are able to control the VCSEL laser mode. Different mode orders lase at different wavelengths. Therefore, an array of VCSELs can be achieved with each channel, or laser emission, having a different wavelength because of the different etching features, thus different lasing mode orders. Typically, a multimode high order VCSEL will generate multiple wavelengths. Each VCSEL device of the array of the present invention operates as an annular waveguide thereby operating to achieve a stable single mode high order output having a single wavelength. This achievement of an array of VCSEL devices emitting light of varying wavelengths, supports the requirement for multichannel parallel data transmission to achieve increased data transmission rates.

Various changes and modifications to the embodiments herein chosen for purposes of illustration will readily occur to those skilled in the art. For example, it should be understood that VCSEL structure symmetry will exists for both p and n dopants as well as electrically inverted structure designs. To the extent that such modifications and variations do not depart from the spirit of the invention, they are intended to be included within the scope thereof which is assessed only by a fair interpretation of the following claims.

What is claimed is:

1. An array of annular waveguide vertical cavity surface emitting lasers comprising:
   a first single mode annular waveguide vertical cavity surface emitting laser characterized as emitting light of a first wavelength;
   an at least one additional single mode annular waveguide vertical cavity surface emitting laser characterized as emitting light of a wavelength different than the first single mode annular waveguide vertical cavity surface emitting laser, the first single mode annular waveguide vertical cavity surface emitting laser and the at least one additional single mode annular waveguide vertical cavity surface emitting laser monolithically integrated and having a common active structure.

2. An array of annular waveguide vertical cavity surface emitting lasers as claimed in claim 1 wherein the first single mode annular waveguide vertical cavity surface emitting laser and the at least one additional single mode annular waveguide vertical cavity surface emitting laser share an epitaxial growth structure including a plurality of layers.

3. An array of annular waveguide vertical cavity surface emitting lasers as claimed in claim 2 wherein the plurality of layers include a substrate element, a first mirror stack, an active structure and a second mirror stack.

4. An array of annular waveguide vertical cavity surface emitting lasers as claimed in claim 3 wherein the second mirror stack is etched to define the first single mode annular waveguide vertical cavity surface emitting laser and the at least one additional single mode annular waveguide vertical cavity surface emitting laser.

5. An array of annular waveguide vertical cavity surface emitting lasers as claimed in claim 4 wherein the first single mode annular waveguide vertical cavity surface emitting laser and the at least one additional single mode annular waveguide vertical cavity surface emitting laser emit light having a wavelength in a range of 765–970 nm.

6. An array of annular waveguide vertical cavity surface emitting laser comprising:
   a substrate element having a surface;
   a first mirror stack formed on the surface of the substrate element;
   an active region with a quantum well, the active region being disposed on the first mirror stack; and
   a second mirror stack disposed on the active region, the second mirror stack etched to define a monolithically integrated single mode first annular waveguide vertical cavity surface emitting laser emitting light of a first wavelength and at least one additional single mode annular waveguide vertical cavity surface emitting laser emitting light of a second wavelength, each of the first single mode annular waveguide vertical cavity surface emitting laser and the at least one additional single mode annular waveguide vertical cavity surface emitting laser including an etched portion defining an annular emission region and a non-lasing area.

7. An array of annular waveguide vertical cavity surface emitting lasers as claimed in claim 6 wherein the etched portion of each of the first single mode annular waveguide vertical cavity surface emitting laser and the at least one additional single mode annular waveguide vertical cavity surface emitting laser defining the annular emission regions are configured to emit light with a wavelength in a range of approximately 765–970 nm.

8. An array of annular waveguide vertical cavity surface emitting lasers as claimed in claim 7 wherein the etched portion is defined by etching down through the second mirror stack of each of the first single mode annular waveguide vertical cavity surface emitting laser and the at least one additional single mode annular waveguide vertical cavity surface emitting laser in a range of 0.1–3.0 microns.

9. An array of annular waveguide vertical cavity surface emitting lasers as claimed in claim 8 wherein light emitted by each of the first single mode annular waveguide vertical cavity surface emitting laser and the at least one additional single mode annular waveguide vertical cavity surface emitting laser is in a single wavelength spectrum.

10. An array of annular waveguide vertical cavity surface emitting lasers as claimed in claim 9 wherein the second mirror stack is etched to define the first single mode annular waveguide vertical cavity surface emitting laser and the at least one additional single mode annular waveguide vertical cavity surface emitting laser, each defined by a mesa having a defined diameter and a mode order, thus wavelength, that is adjustable by varying the defined diameter of the non-lasing area relative to the diameter of the defined mesa.

11. An array of annular waveguide vertical cavity surface emitting lasers comprising:
   a first mirror stack including mirror pairs in a $Al_xGa_{1-x}As/Al_yGa_{1-y}As$ material system;
   an active region including an active structure sandwiched between a first cladding region adjacent the first mirror stack and a second cladding region, the active structure having at least one quantum well; and a second mirror stack disposed on the second cladding region and including mirror pairs in a $Al_xGa_{1-x}As/Al_yGa_{1-y}As$ material system, the second mirror stack etched to define a monolithically integrated first single mode annular waveguide vertical cavity surface emitting laser characterized as emitting light of a first wavelength and at least one additional single mode annular waveguide vertical cavity surface emitting laser characterized as emitting light of a wavelength different than the first single mode annular waveguide vertical cavity surface emitting laser, each of the first single mode annular waveguide vertical cavity surface emitting laser and the at least one additional single mode annular waveguide vertical cavity surface emitting laser including an etched region thereby defining an emission wavelength and confining a lasing mode of each of the single mode annular waveguide vertical cavity surface emitting lasers to an annular emission region.

12. An array of annular waveguide vertical cavity surface emitting lasers as claimed in claim 11 wherein the first mirror stack, the active region and the second mirror stack are configured so the first single mode annular waveguide vertical cavity surface emitting laser and the at least one additional single mode annular waveguide vertical cavity surface emitting laser operate in a stable single high order mode.

13. An array of annular waveguide vertical cavity surface emitting lasers as claimed in claim 12 wherein the first single mode annular waveguide vertical cavity surface emitting laser and the at least one additional single mode annular waveguide vertical cavity surface emitting laser are configured to emit light with a wavelength in a range of approximately 765–970 nm.

* * * * *